(12) United States Patent
Boehme

(10) Patent No.: US 7,076,423 B2
(45) Date of Patent: Jul. 11, 2006

(54) CODING AND STORAGE OF PHONETICAL CHARACTERISTICS OF STRINGS

(75) Inventor: Thomas Boehme, Leinfelden-Echterdingen (DE)

(73) Assignee: International Business Machines Corporation, Armonk, NY (US)

( * ) Notice: Subject to any disclaimer, the term of this patent is extended or adjusted under 35 U.S.C. 154(b) by 381 days.

(21) Appl. No.: 09/749,375

(22) Filed: Dec. 21, 2000

(65) Prior Publication Data

US 2001/0032073 A1 Oct. 18, 2001

(30) Foreign Application Priority Data

Dec. 21, 1999 (EP) ................... 99125463

(51) Int. Cl.
*G10L 19/02* (2006.01)
*G10L 17/00* (2006.01)
*G06F 17/30* (2006.01)

(52) U.S. Cl. .......................... 704/229; 704/250; 707/1
(58) Field of Classification Search ................ 715/533, 715/531; 707/6, 5, 1; 704/260, 250, 254, 704/233, 229
See application file for complete search history.

(56) References Cited

U.S. PATENT DOCUMENTS 5,724,597 A * 3/1998 Cuthbertson et al. ....... 715/531

OTHER PUBLICATIONS

Erikson, Klas, "Approximate Swedish Name Matching—Survey and Test of Different Algorithms," 1997, Nada report TRITA-NA-E9721.*
Gadd, "PHONIX: The algorithm," Program, 1990, vol. 24, No. 4, pp. 363-366.*
Lait et al., "An Assessment of Name Matching Algorithms," 1996, Technical Report, Department of Computing Science, University of Newcastle upon Tyne, UK.*
Pfeifer et al., "Retrieval Effectiveness of Proper Name Search Methods," Information Processing and Management, 1996, pp. 667-679.*

* cited by examiner

*Primary Examiner*—Richemond Dorvil
*Assistant Examiner*—V. Paul Harper
(74) *Attorney, Agent, or Firm*—Ference & Associates

(57) ABSTRACT

The present invention relates to coding and storage of phonetic features in order to search for strings of characters, whereby it is applied in particular to searching for a variety of names, identifiers, denotations and other character strings in a database. This is achieved by a method and system for coding and storing phonetic information representable as an original character sequence in which the phonetic information is coded in a bit code which does not comprise any characters. In some embodiments, tables are used and which comprise character groups that are found empirically and reflect the specific phonetics and method of spelling a name adapted to the actual language in use. This enables efficient coding of phonetic features associated with said groups and provides for adapting the coding method of the present invention to a plurality of different languages.

4 Claims, 7 Drawing Sheets

| COMBINATION | REPLACED BY |
|---|---|
| BL | BAL |
| BR | BAR |
| CHI, CI | SI |
| CH | K |
| CY | SY |
| DS, PS, SCH, TS, X | S |
| DM | DIM |
| EU, EW, IU, JU, YU | U |
| GE | JE |
| GI | JI |
| IA, YA | JA |
| IE, YE | JE |
| IO, YO | JO |
| KN | N |
| MAC | MC |
| NG | N |
| PL | PAL |
| PR | PAR |
| PT | T |
| WR | R |

| LETTER | CODE |
|---|---:|
| B, F, P, V | 1 |
| C, G, J, K, Q, S, X, Z | 2 |
| D, T | 3 |
| L | 4 |
| M, N | 5 |
| R | 6 |

FIG.1

| COMBINATION | REPLACED BY |
|---|---|
| BL | BAL |
| BR | BAR |
| CHI, CI | SI |
| CH | K |
| CY | SY |
| DS, PS, SCH, TS, X | S |
| DM | DIM |
| EU, EW, IU, JU, YU | U |
| GE | JE |
| GI | JI |
| IA, YA | JA |
| IE, YE | JE |
| IO, YO | JO |
| KN | N |
| MAC | MC |
| NG | N |
| PL | PAL |
| PR | PAR |
| PT | T |
| WR | R |

FIG.4

| COMBINATION | REPLACED BY |
|---|---|
| AUX | AU |
| OUX | OU |
| MACHER | MAKER |
| STON, STONE | SON |
| BT | T |
| GN | N |
| GS | G |
| LS | L |
| NG | N |
| PS | P |
| RS, RTS | R |
| TS | T |

FIG.5

| COMBINATION | REPLACED BY |
|---|---|
| ACH | AK |
| CE | SE |
| CHN | KN |
| CHT | KT |
| CH | S |
| CI | SI |
| CY | SY |
| CZ | Z |
| DG | J |
| DS | Z |
| IGH | I |
| IJ | I |
| LCH | LK |
| MPS | MS |
| MPT | MT |
| NG | N |
| OCH | OK |
| PF | F |
| PH | F |

FIG.6

| LETTER | CODE |
|---|---|
| A, E, I, O, U, Y | 0 |
| B, P | 8 |
| C, G, J, K, Q | 4 |
| D, T | 3 |
| F, V | 7 |
| M, N | 5 |
| L | 1 |
| S, X, Z | 2 |
| R | 6 |

FIG.7

CODING AND STORAGE OF PHONETICAL CHARACTERISTICS OF STRINGS

CLAIM FOR PRIORITY

This application claims priority from European Patent Application No. 99125463.2 filed on Dec. 21, 1999, and which is hereby incorporated by reference as if fully set forth herein.

FIELD OF THE INVENTION

The present invention relates to coding and storage of phonetic features. In particular, it relates to coding and storage of those features in order to search strings of characters according to specific phonetic features and it can be applied in particular to searching for a variety of names, identifiers, denotations and other character strings in a database.

BACKGROUND OF THE INVENTION

A prior art method for coding phonetic features was formally set up during the U.S. census in 1858. A certain abstraction of phonetic features was considered to be required, in particular because at that point of time, a fairly high fraction of immigrants in first or second generation lived there who named their children with some assimilated names, i.e., first names or last names. For example, the name Schmidt was assimilated to Smith, or Johannson to Johnson. As it was foreseeable that the original way for writing these names would be lost anyhow, the evaluation of the census was stored supplementary with those phonetical features without using any electronic data processing.

This method is known by the name SOUNDEX and is applied until now in many technical fields, for example, in reservation systems in which lists of names are searched according to phonetical features only since customer contact is often by telephone call and the typist may not know the proper spelling of the customer's name. The basic algorithm is the same as it was in 1858 and comprises the rules and steps as follows:

1. Every code according to SOUNDEX contains four characters: a letter followed by three digits whereby in case of missing digits the code is filled up with the digit '0'.

2. The first letter of the character string which is transformed by the SOUNDEX code, for example a name, is taken without any change as the first code element into the SOUNDEX code.

3. The letters a, e, i, o, u, y, w, h are not coded. All remaining characters are coded as follows:

b, f, p, v are coded to 1 c, g, j, k, q, s, q, z are coded as 2 d, t are coded as 3 l is coded as 4 m, n is coded as 5 r is coded as 6.

4. Two subsequent occurrences, i.e., instances, of the same SOUNDEX code is avoided by only taking the first of them.

Based on the above mentioned rules the following examples result:

| | |
|---|---|
| Euler | E460 |
| Gauss | G200 |
| Hilbert | H416 |
| Heilbronn | H416 |
| Schmidt | S530 |
| Smit | S530 |

A more detailed description of the prior art SOUNDEX coding method is provided by D. Knuth in 'The Art of Computer Science, Vol. III', Addison-Wesley, 2nd ed., S. 391–392.

The disadvantages of said prior art SOUNDEX coding method can be summarized as follows:

1. The SOUNDEX code is limited to 1+3=4 characters. As a typically character string has a bigger length, e.g., a length between 6 and 8 characters not all characters can be coded. Thus, as described above the character strings 'Hilbert' and 'Heilbronn' have the same SOUNDEX code although they sound quiet different, they have a different length and they can thus be described as 'not related with each other'. In this respect the SOUNDEX method is too ambiguous.

2. The rules of the SOUNDEX method are not able to transfer longer character groups into their phonetical equivalence. The SOUNDEX method is limited to avoiding the vowels and to the comprehension of consonants having the same phonetic code. The SOUNDEX code is not adapted to particular letter combinations as are for example the English 'ight' as in 'fight' which has the same phonetic features as 'ite'.

3. Today, phonetic features are often stored together with the original data in a data base. Accordingly, the SOUNDEX code properties have to be checked for the persistency and comparability. Such a check yields that the SOUNDEX code has to be stored as a character string as it comprises at least one character and a character compare procedure has to be started against the code whenever the SOUNDEX code is applied in a database search. Compared to a bit string compare procedure this represents a significant loss of performance.

SUMMARY OF THE INVENTION

The present invention broadly contemplates method and system for coding and storing phonetic information representable as an original character sequence which is less ambiguous and provides better computing performance.

The present invention, in accordance with at least one presently preferred embodiment, broadly contemplates a method and system for coding and storing phonetic information representable as an original character sequence in which the phonetic information is coded in a bit code which does not comprise any characters. Thus, the original character string is considered to be derived from the original phonetic information which is intended to be coded and stored according to the present invention. In particular, the method of the present invention addresses names as original character sequences. For simplification, the following disclosure of the present invention provides a reference to 'names' when an original character sequence is considered to be coded according to the inventional method. Preferably the present invention works on a name base, i.e., all steps referred to during explanation of the coding method are performed for each name separately.

In a preferred embodiment of the present invention the code related to a name is 32 bit long.

According to a further preferred embodiment of the present invention, the inventional coding method comprises the step of replacing at least one group of characters of the name by a respective number of so-called 'normalized' character groups having the same or a similar sound when spoken, but a different spelling. In most cases the normalized group of characters is more simply structured than the original group of characters.

In accordance with another preferred embodiment of the present invention, the original groups of characters are replaced in a particular way, in which a first normalized character group covers the beginning portion of the name, one or more normalized groups cover the middle portion of the name and one group covers the end portion of the name. In this embodiment, the approach is to focus the coding on more than one character of the name, i.e., on two or more groups of characters which has the advantage that the end-product of the coding method, i.e., the code, is less ambiguous compared to the SOUNDEX coding method and thus the quality of the code is increased. Thus, when applied for searching a name stored in a database together with the code of the present invention the probability is increased to find the right name when searching for the phonetic information code according to the present invention instead of a SOUNDEX code.

Another preferred embodiment of the present invention provides that the normalized groups are extracted from dedicated tables which comprise a mapping between character groups of the name and respective normalized character groups. This is an easy and clear way to store and access specific groups of characters and selecting the respective normalized groups.

According to a further preferred embodiment of the present invention, tables are used comprising character groups which are found empirically and which reflect the specific phonetics and way of spelling a name adapted to the actual language in use. This enables for efficient coding of phonetic features associated with said groups and provides for adapting the coding method of the present invention to a plurality of different languages.

In accordance with another preferred embodiment of the present invention, the coding precision decreases with the distance from the beginning of the name. When a name is subjected to the present invention-replacing step a specific character string results as an intermediate product, later to be called 'output name'. Each character is now subjected to a conversion into a respective bit string. As the alphabet is a sequence of 26 letters a code length of $\log_2 26=5$ bits are sufficient to code a character in an unambiguous way. However, it is proposed to code only the first letter with a resolution this high since it usually represents the most important sound of a name. For example, if an output name consists of 8 characters, instead of coding each character with the same precision, i.e., the quantity of bits, the first character of the name is coded with 5 bits, the second character is coded with 4 bits, the third character and the fourth are again coded with 4 bits and the rest of the characters, i.e., characters 5 to 8, are coded with 3 bits. Thus, the first character is defined uniquely, the three following characters are defined quite well as $2^4=16$ different characters can be represented by 4 bits whereas the remaining characters in the exemplary name are coded with a decreased degree of coding precision. The coding can therefore be described as progressively lossy.

The basic principle which is the basis for the present invention is the realization that the most aggravating disadvantage of prior art SOUNDEX coding method is that the phonetic code is itself represented as a string of characters. This causes a decrease in computing performance as well as a waste of a large fraction of the bandwidth which is not utilized since the SOUNDEX code needs at least 4 characters—characters mentioned here means letters plus digits. That is, 32 bits are needed for the representation.

The specific information content of the SOUNDEX code when the SOUNDEX code is converted to a binary bit code is very low as revealed by the following computation.

$$(26*6*6*6)/(256*256*256*256)=5616/4294967296>0,000001306$$

This corresponds to an information content of less than 1 part per thousand. By representing the phonetic information as a sequence of bits, i.e., a binary value, the performance of a database search is significantly increased as binary values can be compared much faster than character strings.

Moreover, additional information can be represented in the binary code.

In accordance with another preferred embodiment of the present invention it is proposed to code the phonetic information in a binary bit code having a length of 32 bit for each name. Generally, a name is to be understood herein as a sequence of characters which is normally representable as one word. Thus in most cases names can be defined by the characters which are placed between two spaces.

The above mentioned degressive coding is a further advantageous aspect of the present invention. One preferred embodiment for this relative to a 32 bit coding for each name is set forth as follows:

| 11111 | 2222 | 3333 | 4444 | 555 | 666 | 777 | 888 | 999 |
|---|---|---|---|---|---|---|---|---|
| | 1. Byte | | 2. Byte | | 3. Byte | | 4. Byte | |

The digits in the first row represent the coding of the respective character associated with the output name. In particular the first character is coded in the first 5 bits, the second character is coded in the next 4 bits, the third character is coded in the next 4 bits, the fourth character is coded in the next 4 bits, the fifth up to the ninth character is coded with 3 bits each. This fills up 32 bits completely. This particular degressive way to code the phonetic features is consistent with the significance of letters which are part of a character string as for example in names. Generally such names are best recognized when the first letter of them is known.

In accordance with additional preferred embodiments of the present invention, the coding and storing method of the present invention can be split up into several steps, most of which are independent from each other. However, when all steps are performed in the sequence which is proposed in the preferred embodiment, infra, a good result can be reached.

It is further noted that any implementation of the method of the present invention can merge those single steps into one step. Thus for the scope of the present invention it is not decisive in which way steps are separated from each other in the source code of a program which implements the method of the present invention.

As will be appreciated by a person skilled in the art the advantageous features mentioned above are mostly independent from each other. Thus, suppressing some of the above mentioned steps may yield a decreased quality of the phoentic code but may still yield a code which has a significantly higher quality compared to the prior art SOUNDEX code even if some marginal prior art improvements to SOUNDEX method are considered.

BRIEF DESCRIPTION OF THE DRAWINGS

The invention is described in detail below with reference to the following schematic drawings:

Figure 1:
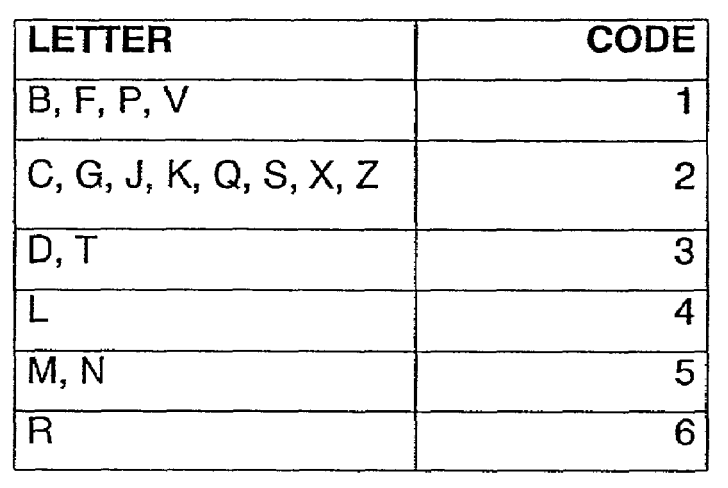

FIG. 1 is a prior art SOUNDEX table showing the mapping between letters and SOUNDEX code.

FIG. 4 is a table showing how combinations, i.e., groups of letters are replaced by respective simplified letters.

FIG. 5 is a table showing how combinations, i.e., groups of letters are replaced by respective simplified letters.

FIG. 6 is a table showing how combinations, i.e., groups of letters are replaced by respective simplified letters.

FIG. 7 shows a table representing a mapping between letters and an intermediate number code.

DETAILED DESCRIPTION OF THE INVENTION

Figure 2:
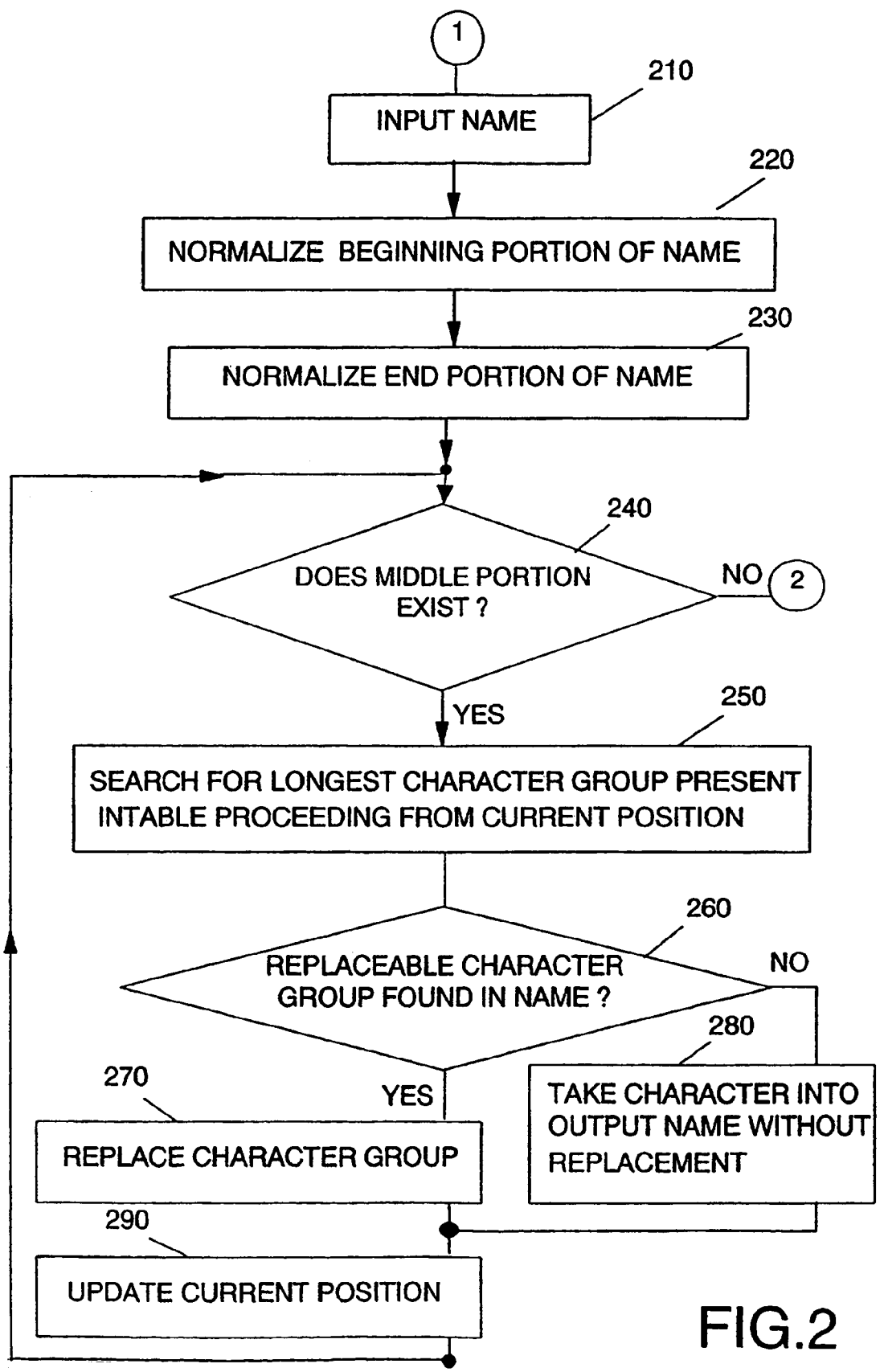
FIG. 2 is a schematic block diagram showing the basic steps to be performed according to the coding and storing method of the present invention, in accordance with a preferred embodiment thereof.

With general reference to the figures and with special reference now to FIGS. 2 and 3, the essential steps of the method according to the invention are summarized below.

In a first step 210 the name in question is subjected to the method of the present invention.

In a step 220 the beginning portion of the name is normalized. This is advantageously done by aid of a table look-up which references some combinations of characters which occur in the name and which are replaced by a different combination of characters, or sometimes only by one character thus yielding the normalized form of the beginning portion of the name.

With additional reference to FIG. 4, an exemplary table is given which is adapted to the English language and covers some commonly-used combinations of letters occurring in English language words and names. As shown in the table the right column reflecting the target combinations is a set of character strings which is smaller in number than the corresponding set of source strings. Thus, a compression is already achieved by said step to some degree. Further, the way of spelling is simplified in most cases, see for example the column which contains the character strings EU, EW, etc. Further, said replacement implies sometimes an insertion of a vowel and sometimes suppressing a vowel. This is done in order to cater for transliterations, i.e. positional swapping of vowels, in the target strings.

It should be noted that a table as it is depicted in FIG. 4 can be configured freely and that other adequate replacements can be added into it, as well as some of them can be omitted without changing the essential characteristics of the coding method of the present invention. Further, it should be noted that the contents of the table depicted in FIG. 4, as well as a further table depicted in FIG. 5, or FIG. 6 should always be adapted to the cultural environment and the language from which the majority of names which are searched during any computer application of the method of the present invention.

Further, it should be noted that during said step 220 only one replacement shall be performed. In particular, if after a first replacement a sequence of characters is generated which comprises a source combination, again, then, another replacement is not done. If it was, the intended aim of said step would miss.

Then, in a further step 230 basically the same type of replacement is applied to the end portion of the name using, however, a different table which is exemplarily depicted as FIG. 5. When reading said table it should appreciated that such a table can be edited in a particular manner in order to be dedicated for personal names, and has a different content if it is dedicated for comprising a more general phonetic coding.

Then, in a sequence of steps 240 to 290 any occurrences of combinations contained in the name starting from the second letter are replaced by similarly sounding combinations, or single letters. This is done advantageously via an iterative procedure beginning with a decision 240 which determines if a middle portion which can be subjected to that third replacement procedure exists or not. In case the name only comprises the beginning portion and the end portion mentioned above no middle portion exists. Thus, in the no-branch of step 240 the method continues with step 310 depicted in FIG. 3. Else, the middle portion is scanned iteratively for occurrences as they are exemplarily depicted in the table of FIG. 6, left column.

In order to do that in each iteration step the respective longest character group which is present in the table is checked if it occurs in the name at the current position, which is at the beginning of the iterations the second letter in the name.

Thus, when a replaceable character group is found in the name, step 260 replaces it by the character group specified in the respective row of the table depicted in FIG. 6. If no replaceable character group is found the respective character corresponding to the current position in the name is taken directly into an intermediate 'output name' without any replacement. The term 'output name' is considered as an intermediate name string which is then treated according to steps 310*ff*.

Then, in a step 290 the actual position is updated, i.e., the position at which letters of the name are further analyzed is advanced by as many letters as were replaced in step 270, or taken into the output name in step 280.

Then, control is fed back to step 240 for determining if the middle portion of the name was already treated completely, or if the end portion of the name has been retrieved by forwarding the current position from step 290.

In the yes-branch the before mentioned procedure is repeated and it is continued in the same way until the end portion which was already treated is retrieved. Thus, the no-branch of decision 240 is reached.

Figure 3:
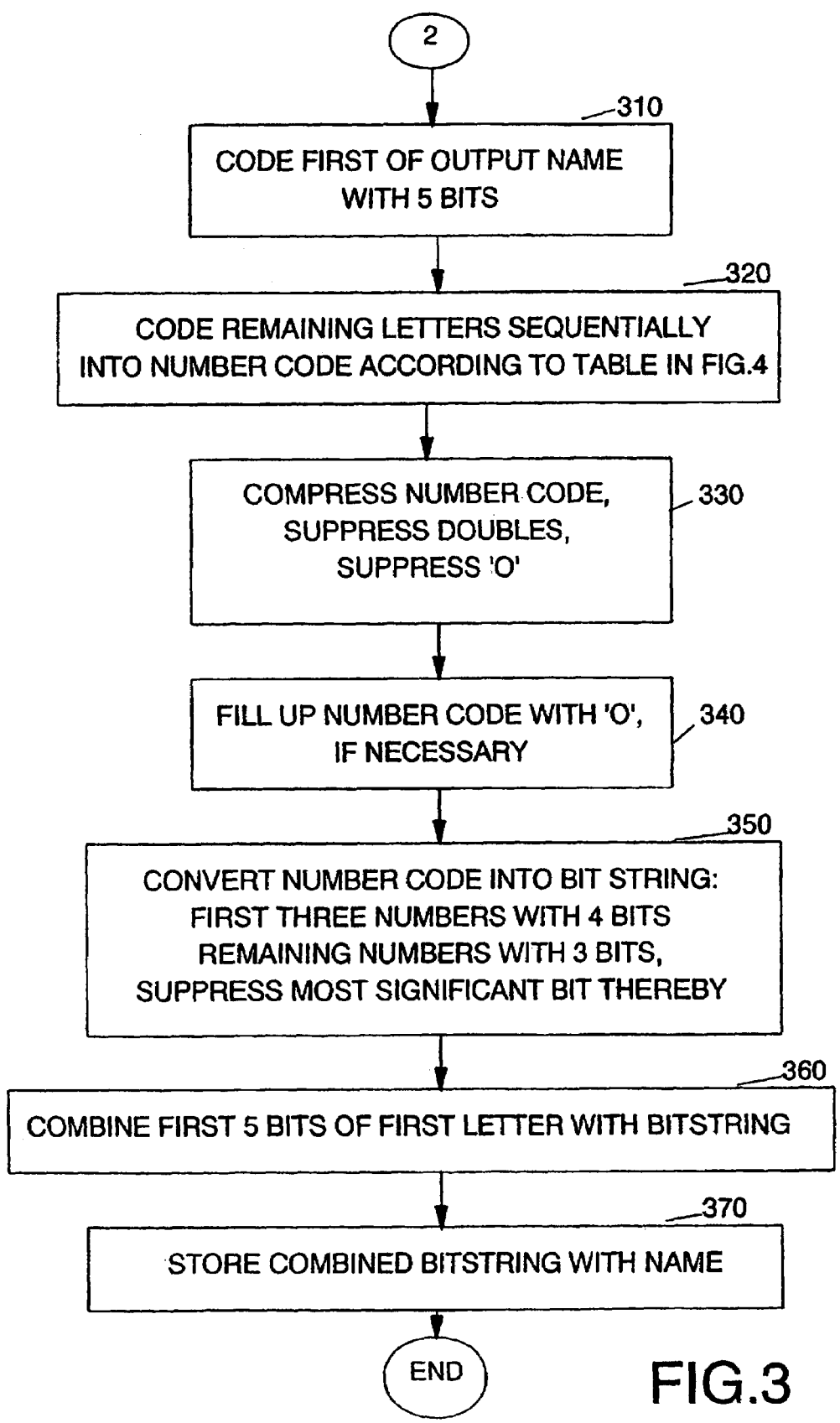
FIG. 3 is a schematic block diagram showing the basic steps to be performed according to the coding and storing method of the present invention, in accordance with a preferred embodiment thereof.

In a next step 310—see FIG. 3 now—the first letter of the name is now coded with 5 bits by using for example the position of the letter in the alphabet. Of course, different ways to code can be applied, too. Thus, A becomes 00000,
B becomes 00001,
C becomes 00010,
. . .
Z becomes 11001

By that, the first letter of the name is represented without any ambiguity in the bit code. Step 220 takes care of the desirable coding of the phonetic features of the first letter.

Then, in a next step 320, the remaining letters are sequentially coded into an intermediate phonetic code according to the table depicted in FIG. 7. The mapping depicted in said table represents a kind of extended SOUNDEX code in which the letters 'h' and 'w' are not coded and are thus suppressed.

The mapping depicted in FIG. 7 results in digits ranging from 0 to 8 each of which represents a class of characters. Concatenating the values for each character of the output name yields the intermediate phonetic code. In a next step 330 the intermediate phonetic code is compressed according to the following rules:

1. When two or more digits with the same value are found directly subsequent to each other only the first digit of the respective group is taken into account whereas the remaining identical digits are suppressed. For example, the intermediate phonetic code of 0440 (Nicki) is reduced to 040.

2. Then, subsequent to the before mentioned step any digits with value '0' at the fourth position or behind are omitted. Similarly, if there is more than one digit having a value of '0' among the first three digits only the first one is taken into account whereas the others are omitted.

EXAMPLES 0502 becomes 052,
305205 becomes 30525,
00306804 becomes 03684.

This feature is not comprised in the prior art SOUNDEX code.

Then, in a step 340 the intermediate phonetic code is either truncated after the eighth position or e filled up with '0' until the number code has a length of 8 digits.

Then, in a step 350 the 8 digit intermediate phonetic code is converted into a bit string, advantageously according to the following rules:

The first three numbers are coded with 4 bits, the remaining numbers are coded with 3 bits, where the most significant bit of the originally 4-bit string is suppressed. Thus, only the most significant bit is suppressed in this respect.

EXAMPLES 30525000 becomes 0011 0000 0101 010 101 000 000 000
03684000 becomes 0000 0011 0110 000 100 000 000 000

Then in a next step 360 the first 5 bits of the first letter which was coded in step 310 is combined with the bit string generated in step 350 by appending the bit string from step 350 at the end of the 5-bit string, i.e. beginning with bit number 6.

EXAMPLE

Thompson becomes 10011001 10000010 10101010 00000000
Lauterbach becomes 01011000 00011011 00001000 00000000

Then, in a step 370 the resulting 32 bit long, combined bit string is stored together with the input name, for example in a database.

Said database can, for example, belong to a customer care service center where the customer's details are kept in said database. When entering and saving the details of the customer the algorithm described above is used to compute the phonetic value of the customer's family name, for example. This value is stored in the database together with the customer record. Other attributes associated to the customer could be stored in the same way if this was appropriate to do from a business point of view.

When a customer calls the service center via a telephone call, for example, the telephonist of the customer care service center is enabled to find the proper customer record by typing the customers name into the system in a way she or he has understood the phonetic sound of the customer's name via the telephone line. The system is then enabled to use the very same algorithm in order to calculate the phonetic value of the customer name to search for. Via any prior art index search on the phonetic value in the database a set of phonetically matching customer records is returned as a search result. This set can either be presented to the customer representative directly, or it can be filtered and sorted by any additional matching algorithms before it is presented to the representative.

It should be noted that the very same algorithm including all parameterisations needs to be used for both storing and searching customer records. Otherwise the phonetic value for similar or even for the same string maybe different between the two applications.

In the foregoing specification the invention has been described with reference to a specific exemplary embodiment thereof. It will, however, be evident that various modifications and changes may be made thereto without departing from the broader spirit and scope of the invention as set forth in the appended claims. The specification and drawings are accordingly to be regarded as illustrative rather than in a restrictive sense.

The present invention can be realized in hardware, software, or a combination of hardware and software. A coding and storage tool according to the present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software could be a general purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods.

Computer program means or computer program in the present context mean any expression, in any language, code or notation, of a set of instructions intended to cause a system having an information processing capability to perform a particular function either directly or after either or both of the following:

a) conversion to another language, code or notation;
b) reproduction in a different material form.

Although the preferred embodiments of the present invention have been described with the specific examples, those skilled in the art will appreciate that various changes and modifications can be made therein without departing from the scope of the spirit of the present invention.

What is claimed is:

1. A method for coding phonetic information, the method comprising the steps of:
 identifying phonetic features of a character sequence;
 representing the identified phonetic features as a bit string, wherein the bit string has a length of 32 bits;
 replacing at least one group of characters, in the character sequence with a corresponding number of normalized character groups having the same or a similar sound when spoken but a different spelling;

covering the beginning portion of the character sequence with a first normalized character group;

covering the middle portion of the character sequence with one or more of said normalized character groups;

covering the end portion of the character sequence with one of said normalized character groups; coding a first character of the character sequence with five (5) bits; and decreasing a coding precision with a distance from the beginning of the character sequence.

2. A program storage device readable by machine, tangibly embodying a program of instructions executable by said machine to perform method steps for coding phonetic information, said method comprising the steps of:

identifying phonetic features of a character sequence, wherein the character sequence is a name;

representing the identified phonetic features as a bit string;

replacing at least one group of characters, in the character sequence, with a corresponding number of normalized character groups having the same or similar sound when spoken with a different spelling;

covering the beginning portion of the character sequence with a first normalized character group;

covering the middle portion of the character sequence with one or more of said normalized character groups;

covering the end portion of the character sequence with one of said normalized character groups;

extracting said normalized character groups from particular tables providing a mapping between the character sequence and said normalized character groups by a respective provision of a cross-reference in said table;

empirically founding said tables comprising groups of character sequences;

spelling actual language in use which reflect the specific phonetics;

decreasing a representative precision with a distance from the beginning of said original character sequence;

representing the first character of the character sequence with a 5-bit bit string.

3. A program storage device readable by machine, tangibly embodying a program of instructions executable by the machine to perform method steps for providing symbol insertion in accordance with claim 2, wherein a bit string related to said phonetic information has a length of 32 bits.

4. An apparatus for coding phonetic information, the apparatus comprising:

a coder which codes phonetic information about a character sequence in a bit string;

a deriver which derives said phonetic information from names;

a replacer which replaces at least one group of characters in the character sequence with a corresponding number of normalized character groups having the same or a similar sound when spoken but a different spelling;

a coverer which covers the beginning portion of the character sequence with a first normalized character group;

a second coverer which covers the middle portion of the character sequence with one or more of said normalized character groups;

a third coverer which covers the end portion of the character sequence with one of said normalized character groups;

an extractor which extracts said normalized character groups from particular tables providing a mapping between the character sequence groups and said normalized character groups by a respective provision of a cross-reference in said table;

a founder which empirically founds said tables comprising groups of the character sequences;

a speller which spells actual language in use which reflects the specific phonetics;

a decreaser which decreases coding precision with a distance from the beginning of said original character sequence;

a second coder which codes the first character of the character sequence with a 5-bit bit string.

* * * * *